United States Patent
Kim et al.

(10) Patent No.: US 10,256,282 B2
(45) Date of Patent: Apr. 9, 2019

(54) DISPLAY APPARATUS HAVING REDUCED DEFECTS

(71) Applicant: Samsung Display Co., Ltd., Gyeonggi-do (KR)

(72) Inventors: Dongsoo Kim, Gyeonggi-do (KR); Wonkyu Kwak, Gyeonggi-do (KR); Jieun Lee, Gyeonggi-do (KR); Joongsoo Moon, Gyeonggi-do (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/439,739

(22) Filed: Feb. 22, 2017

(65) Prior Publication Data

US 2018/0061917 A1 Mar. 1, 2018

(30) Foreign Application Priority Data

Aug. 29, 2016 (KR) .................. 10-2016-0110094

(51) Int. Cl.
*H01L 27/32* (2006.01)
*H01L 51/00* (2006.01)
*H01L 51/52* (2006.01)

(52) U.S. Cl.
CPC ...... *H01L 27/3258* (2013.01); *H01L 27/3244* (2013.01); *H01L 51/0097* (2013.01);
(Continued)

(58) Field of Classification Search
CPC . H01L 51/50–51/56; H01L 51/0032–51/0095;
(Continued)

(56) References Cited

U.S. PATENT DOCUMENTS

| 9,323,291 B2 | 4/2016 | Oh et al. |
| 2005/0078459 A1 | 4/2005 | Yeon |

(Continued)

FOREIGN PATENT DOCUMENTS

| EP | 3051333 A1 | 8/2016 |
| KR | 10-2014-0120509 A | 10/2014 |

(Continued)

OTHER PUBLICATIONS

European Search Report corresponding to EP Application No. 17173138.3, dated Dec. 13, 2017, 9 pages.

*Primary Examiner* — Tucker J Wright
(74) *Attorney, Agent, or Firm* — Innovation Counsel LLP

(57) ABSTRACT

Provided is a display apparatus capable of reducing generation of defects during manufacturing processes or while in use after being manufactured. The display apparatus includes a substrate including a first area including a display area, a second area spaced apart from the first area, and a bent area between the first area and the second area and connecting the first area and the second area to each other, wherein the substrate is bent about a bending axis; an inorganic insulating layer over the substrate, wherein the inorganic insulating layer includes a first opening or a first groove corresponding to the bent area and a second opening or a second groove at outside the display area to extend along at least a part of the display area; and an organic material layer at least partially filling the first opening or the first groove and the second opening or the second groove.

20 Claims, 12 Drawing Sheets

(52) U.S. Cl.
CPC ...... *H01L 51/5246* (2013.01); *H01L 51/5253* (2013.01); *H01L 2251/5338* (2013.01); *H01L 2251/558* (2013.01)

(58) Field of Classification Search
CPC .......................... H01L 27/32–27/3297; H01L 27/3244–27/3279; H01L 51/0097; H01L 2251/5338; H01L 2251/558
See application file for complete search history.

(56) References Cited

U.S. PATENT DOCUMENTS

| | | |
|---|---|---|
| 2015/0036299 A1 | 2/2015 | Namkung et al. |
| 2016/0079539 A1 | 3/2016 | Kim et al. |
| 2016/0204183 A1* | 7/2016 | Tao .................... H01L 51/0097 257/40 |
| 2016/0218305 A1 | 7/2016 | Kim et al. |
| 2016/0233248 A1 | 8/2016 | Kwak |
| 2016/0270209 A1 | 9/2016 | Cho |
| 2016/0365398 A1 | 12/2016 | Kim |

FOREIGN PATENT DOCUMENTS

| | | |
|---|---|---|
| KR | 10-2015-0015257 A | 2/2015 |
| KR | 10-2015-0015257 A | 2/2016 |
| KR | 10-2016-0032791 A | 3/2016 |
| KR | 10-2016-0064373 A | 6/2016 |
| KR | 10-2016-0110688 A | 9/2016 |

\* cited by examiner

DISPLAY APPARATUS HAVING REDUCED DEFECTS

CROSS-REFERENCE TO RELATED APPLICATION

This application claims the benefit of Korean Patent Application No. 10-2016-0110094 filed on Aug. 29, 2016 in the Korean Intellectual Property Office, the disclosure of which is incorporated herein in its entirety by reference.

BACKGROUND

1. Field

One or more embodiments relate generally to a display apparatus, and more particularly to a display apparatus capable of reducing occurrence of defects.

2. Description of the Related Art

In general, a display apparatus includes a display unit above a substrate. In the display apparatus, a display area may be made larger by reducing a non-display area.

However, in a display apparatus according to the related art, when the non-display area is reduced, defects may occur in the display area due to external shocks during manufacture of the display apparatus, or while in use after being manufactured.

SUMMARY

One or more embodiments include a display apparatus capable of reducing occurrence of defects during manufacture of the display apparatus or while in use after being manufactured.

Additional aspects will be set forth in part in the description which follows and, in part, will be apparent from the description, or may be learned by practice of the presented embodiments.

According to one or more embodiments, a display apparatus includes: a substrate including a first area including a display area, a second area spaced apart from the first area, and a bent area between the first area and the second area and connecting the first area and the second area to each other, wherein the substrate is bent about a bending axis; an inorganic insulating layer over the substrate, wherein the inorganic insulating layer includes a first opening or a first groove corresponding to the bent area and a second opening or a second groove located outside the display area to extend along at least a part of the display area; and an organic material layer, wherein the organic material layer at least partially fills the first opening or the first groove, and at least partially fills the second opening or the second groove.

The second opening or the second groove may be connected to the first opening or the first groove. The second opening or the second groove, together with the first opening or the first groove, may collectively surround the display area.

A thickness of the inorganic insulating layer at a central portion of the first area may be greater than a thickness of the inorganic insulating layer proximate to the second opening or the second groove.

The inorganic insulating layer may comprise multiple layers, and a number of layers in the inorganic insulating layer at a central portion of the first area may be greater than a number of the layers in the inorganic insulating layer proximate to the second opening or the second groove.

The inorganic insulating layer may comprise multiple layers at a central portion of the first area, and the inorganic insulating layer may have only a single layer proximate to the second opening or the second groove.

The second area may include a pad area, and the inorganic insulating layer may include a third opening or a third groove located outside the pad area.

The third opening or the third groove may be connected to the first opening or the first groove. The third opening or the third groove, together with the first opening or the first groove, may collectively surround the pad area.

The display apparatus may further include a pad in the pad area, wherein a distance between an end of the third opening or the third groove and the end of the substrate may be less than a distance between an end of the pad and the end of the substrate.

A thickness of the inorganic insulating layer at a central portion of the pad area may be greater than a thickness of the inorganic insulating layer proximate to the third opening or the third groove.

The inorganic insulating layer may comprise multiple layers, and a number of layers in the inorganic insulating layer at a central portion of the pad area may be greater than a number of layers in the inorganic insulating layer proximate to the third opening or the third groove.

The inorganic insulating layer may comprise multiple layers at a central portion of the pad area, and the inorganic insulating layer may have only a single layer proximate to the third opening or the third groove.

The organic material layer may cover an upper surface of the inorganic insulating layer proximate to the first opening or the first groove and an upper surface of the inorganic insulating layer proximate to the second opening or the second groove.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
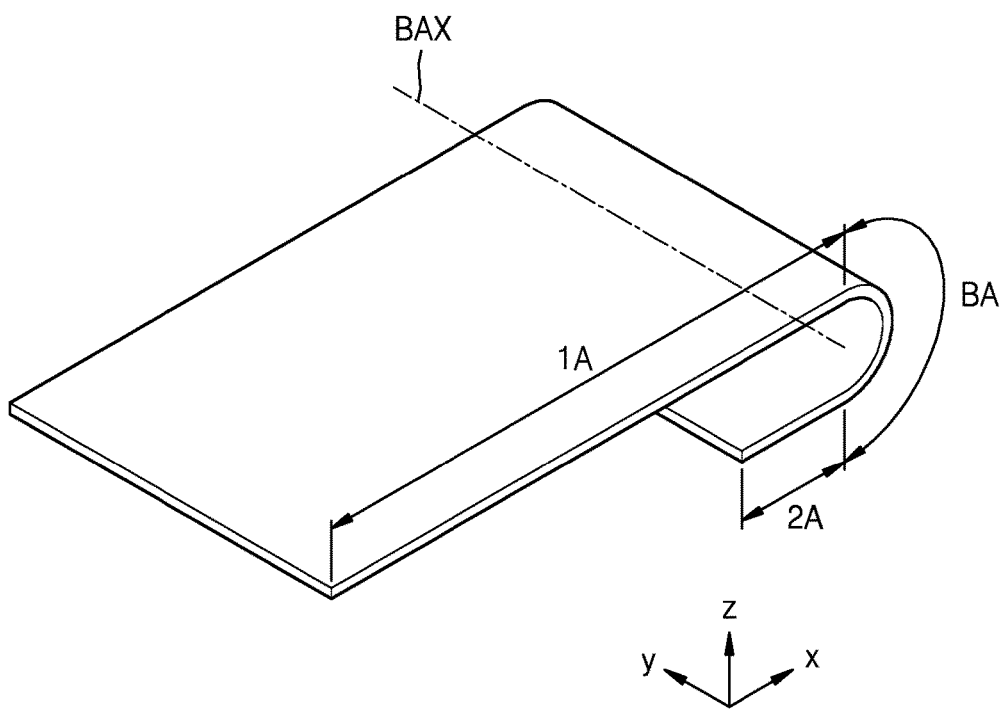
FIG. 1 is a schematic perspective view of a part of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, the present disclosure will be described in detail by explaining preferred embodiments of the inventive concept with reference to the attached drawings. Like reference numerals in the drawings denote like elements.

Sizes of components in the drawings may be exaggerated for convenience of explanation. In other words, since sizes and thicknesses of components in the drawings are arbitrarily illustrated for convenience of explanation, the following embodiments are not limited thereto. Accordingly, the various drawings may not be to scale.

In the following examples, an x-axis, a y-axis and a z-axis are not limited to three axes of the rectangular coordinate system, and may be interpreted in a broader sense. For example, the x-axis, the y-axis, and the z-axis may be perpendicular to one another, or may represent different directions that are not perpendicular to one another. All numerical values are approximate, and may vary. All examples of specific materials and compositions are to be taken as nonlimiting and exemplary only. Other suitable materials and compositions may be used instead.

Figure 2:
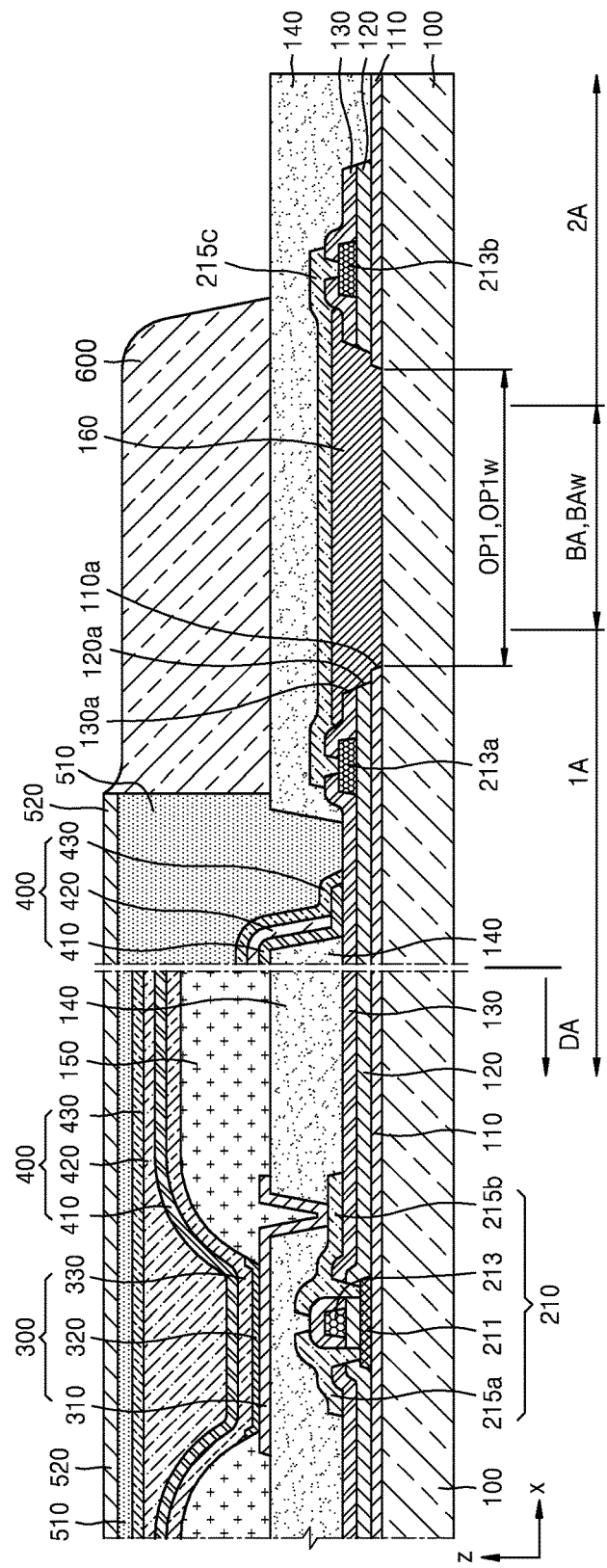
FIG. 2 is a schematic cross-sectional view of a part of the display apparatus of FIG. 1.
Figure 3:
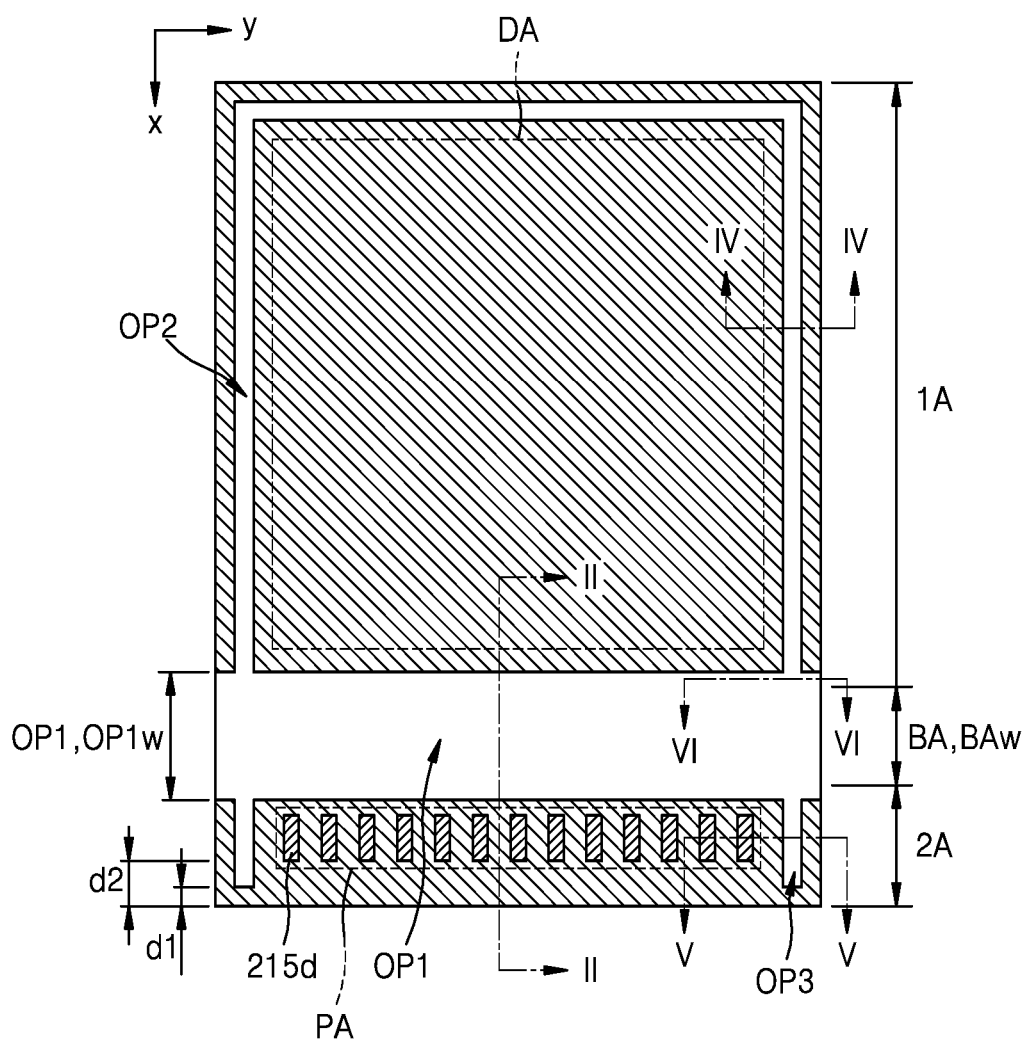
FIG. 3 is a schematic plan view of a part of the display apparatus of FIG. 1.
Figure 4:
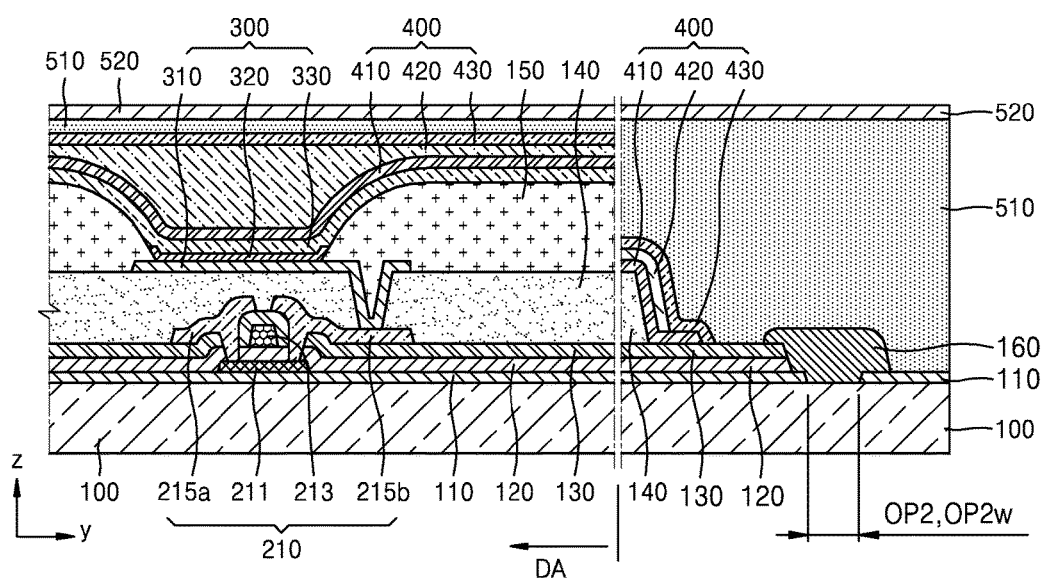
FIG. 4 is a schematic cross-sectional view taken along a line IV-IV of FIG. 3.
Figure 5:
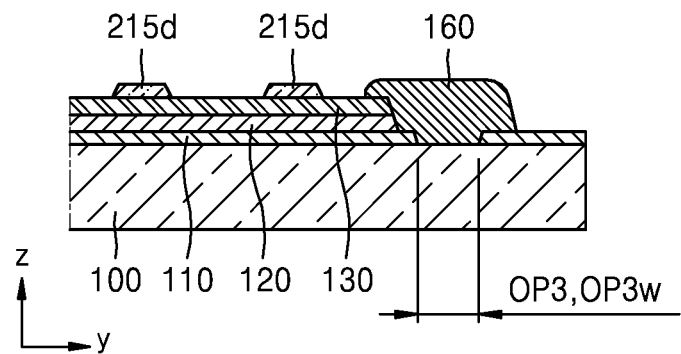
FIG. 5 is a schematic cross-sectional view taken along a line V-V of FIG. 3.
Figure 6:
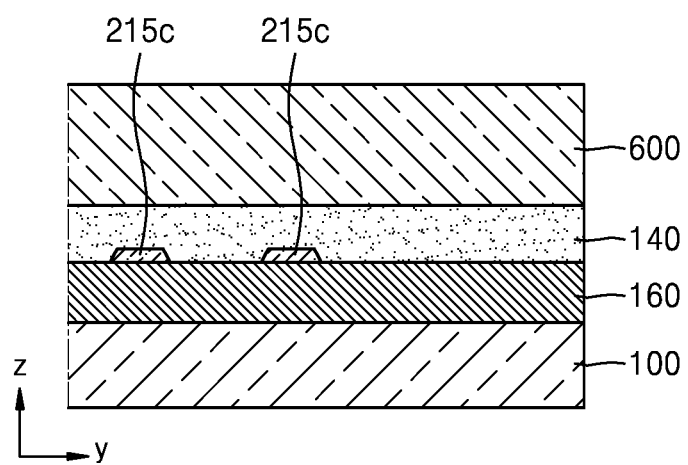
FIG. 6 is a schematic cross-sectional view taken along a line VI-VI of FIG. 3.

FIG. 1 is a schematic perspective view of a part of a display apparatus according to an embodiment, FIG. 2 is a schematic cross-sectional view of a part of the display apparatus of FIG. 1, and FIG. 3 is a schematic plan view of a part of the display apparatus of FIG. 1. FIG. 4 is a schematic cross-sectional view taken along a line IV-IV of FIG. 3, FIG. 5 is a schematic cross-sectional view taken along a line V-V of FIG. 3, and FIG. 6 is a schematic cross-sectional view taken along a line VI-VI of FIG. 3. FIG. 2 may be understood as a cross-sectional view taken along a line II-II of FIG. 3. In FIG. 2 to FIG. 6, the display apparatus is not in a bent state for convenience of description However, the display apparatus according to the embodiment is actually in a state in which a substrate 100 is bent at a bent area BA, as shown in FIG. 1. This applies to both embodiments that will be described later and modified examples thereof.

As shown in FIGS. 1 to 3, a substrate 100 in the display apparatus according to the embodiment includes a bent area BA extending along a first direction (+y direction). The bent area BA is between a first area 1A and a second area 2A and is curved in a second direction (+x direction) crossing the first direction. In addition, the substrate 100 is bent about a bending axis BAX extending in the first direction (+y direction) as shown in FIG. 1. The substrate 100 may include various materials having flexible or bendable characteristics, e.g., polymer resins such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP). The substrate 100 may have a multi-layered structure with two layers including one of the above polymer resins, as well as a barrier layer including an inorganic material such as silicon oxide, silicon nitride, and silicon oxynitride between the two layers.

The first area 1A includes a display area DA. The first area 1A may further include a part of a non-display area outside the display area DA, in addition to the display area DA, as shown in FIG. 2. The second area 2A may also include the non-display area.

In addition to a display device 300, a thin film transistor (TFT) 210 may be located in the display area DA and electrically connected to the display device 300, as shown in FIG. 2. In FIG. 2, an organic light-emitting device is located in the display area DA as the display device 300. Electric connection of the organic light-emitting device to the TFT 210 may be understood as a pixel electrode 310 being electrically connected to the TFT 210.

The TFT 210 may include a semiconductor layer 211, a gate electrode 213, a source electrode 215a, and a drain electrode 215b, the semiconductor layer 211 including amorphous silicon, polycrystalline silicon, or an organic semiconductor material. In order to ensure insulation between the semiconductor layer 211 and the gate electrode 213, a gate insulating layer 120 may be between the semiconductor layer 211 and the gate electrode 213, wherein the gate insulating layer 120 includes an inorganic material such as silicon oxide, silicon nitride, and/or silicon oxynitride. In addition, an interlayer insulating layer 130 may be on the gate electrode 213, and the source electrode 215a and the drain electrode 215b may be on the interlayer insulating layer 130, wherein the interlayer insulating layer 130 includes an inorganic material such as silicon oxide, silicon nitride, and/or silicon oxynitride. The insulating layers that include an inorganic material may be formed by chemical vapor deposition (CVD) or atomic layer deposition (ALD). This will be applied to other embodiments and modifications thereof that will be described later.

A buffer layer 110 may be between the TFT 210 and the substrate 100. The buffer layer 110 may include an inorganic material such as silicon oxide, silicon nitride, and/or silicon oxynitride. The buffer layer 110 may improve smoothness of the upper surface of the substrate 100, or prevent or reduce infiltration of impurities from the substrate 100 into the semiconductor layer 211 of the TFT 210. Another layer such as a barrier layer may be further disposed between the substrate 100 and the buffer layer 110 or between the buffer layer 110 and the TFT 210, wherein the barrier layer may include an inorganic material such as silicon oxide, silicon nitride, and/or silicon oxynitride. In this case, the barrier layer may be regarded as a part of the buffer layer 110. In the drawings, the buffer layer 110 has a single-layered structure for convenience of description. However, in the embodiments of the present disclosure or modified examples thereof, the buffer layer 110 may have a multi-layered structure.

In addition, a planarization layer 140 may be arranged over the TFT 210. For example, as shown in FIG. 2, when the organic light-emitting device is over the TFT 210, the planarization layer 140 may planarize an upper portion of a protective layer that covers the TFT 210. The planarization layer 140 may include, for example, an organic material such as acryl, benzocyclobutene (BCB), and hexamethyldisiloxane (HMDSO).

In FIG. 2, although the planarization layer 140 has a single-layered structure, the planarization layer 140 may be modified in various ways. For example, the planarization layer 140 may have a multi-layered structure. In addition, as shown in FIG. 2, the planarization layer 140 may have an opening outside the display area DA, so that a part of the planarization layer 140 in the display area DA and a part of the planarization layer 140 in the second area 2A may be physically separate from each other. Thus, impurities from outside may not reach the display area DA via the planarization layer 140. In addition, unlike the example shown in FIG. 2, the planarization layer 140 may not be present in, i.e. may be removed from, at least some part of the second area 2A.

In the display area DA of the substrate 100, the display device 300 may be positioned over the planarization layer 140. The display device 300 may be the organic light-emitting device including the pixel electrode 310, an opposite electrode 330, and an intermediate layer 320 between the pixel electrode 310 and the opposite electrode 330 and including an emission layer. The pixel electrode 310 may contact one of the source electrode 215a and the drain electrode 215b via an opening formed in the planarization layer 140 and thus may be electrically connected to the TFT 210, as shown in FIG. 2.

A pixel-defining layer 150 may be on the planarization layer 140. The pixel-defining layer 150 includes openings corresponding respectively to sub-pixels, that is, at least an opening exposing a center portion of the pixel electrode 310, to define pixels. Also, in the example shown in FIG. 2, the pixel-defining layer 150 increases a distance between an edge of the pixel electrode 310 and the opposite electrode 330 above the pixel electrode 310, so as to prevent an arc from being generated at the edge of the pixel electrode 310. The pixel-defining layer 150 may include an organic material, for example, PI or HMDSO.

The intermediate layer 320 of the organic light-emitting device may include low-molecular weight organic materials or polymer materials. When the intermediate layer 320 includes a low-molecular weight organic material, the emission layer may include a hole injection layer (HIL), a hole transport layer (HTL), an emission layer (EML), an electron transport layer (ETL), and an electron injection layer (EIL) in a single or multiple-layered structure, and examples of organic materials may include copper phthalocyanine (CuPc), N,N'-Di(naphthalene-1-yl)-N,N'-diphenyl-benzidine (NPB), and tris-8-hydroxyquinoline aluminum ($Alq_3$). The low-molecular weight organic materials may be deposited by a vacuum deposition method.

When the intermediate layer 320 includes a polymer material, the intermediate layer 320 may include an HTL and an EML. Here, the HTL may include poly(3,4-ethylenedioxythiophene (PEDOT), and the EML may include a polyphenylenevinylene (PPV)-based or polyfluorene-based polymer material. The intermediate layer 320 above may be formed by a screen printing method, an inkjet printing method, or a laser-induced thermal imaging (LITI) method.

However, the intermediate layer 320 is not limited to the above examples, and may have various structures. In addition, the intermediate layer 320 may include a layer that is integrally formed across a plurality of pixel electrodes 310, or a layer that is patterned to correspond to each of the plurality of pixel electrodes 310.

The opposite electrode 330 is arranged above the display area DA, and as shown in FIG. 2, may cover the display area DA. That is, the opposite electrode 330 may be integrally formed with respect to a plurality of organic light-emitting devices, so as to correspond to a plurality of pixel electrodes 310.

Since the organic light-emitting device may be easily damaged by external moisture or oxygen, an encapsulation layer 400 may cover the organic light-emitting device to protect the organic light-emitting device. The encapsulation layer 400 covers the display area DA, and may also extend outside the display area DA. The encapsulation layer 400 may include a first inorganic encapsulation layer 410, an organic encapsulation layer 420, and a second inorganic encapsulation layer 430, as shown in FIG. 2.

The first inorganic encapsulation layer 410 covers the opposite electrode 330, and may include silicon oxide, silicon nitride, and/or silicon oxynitride. If necessary, other layers such as a capping layer may be arranged between the first inorganic encapsulation layer 410 and the opposite electrode 330. Since the first inorganic encapsulation layer 410 is formed to conform to the structure thereunder, the first inorganic encapsulation layer 410 may have an uneven upper surface. The organic encapsulation layer 420 covers the first inorganic encapsulation layer 410, and unlike the first inorganic encapsulation layer 410, the organic encapsulation layer 420 may have an even or flat upper surface. In more detail, the organic encapsulation layer 420 may substantially have an even or flat upper surface at a portion corresponding to the display area DA. The organic encapsulation layer 420 may include at least one material selected from the group consisting of PET, PEN, PC, PI, polyethylene sulfonate, polyoxymethylene, polyarylate, and hexamethyldisiloxane. The second inorganic encapsulation layer 430 covers the organic encapsulation layer 420, and may include silicon oxide, silicon nitride, and/or silicon oxynitride. The second inorganic encapsulation layer 430 may contact the first inorganic encapsulation layer 410 at an edge thereof outside the display area DA, in order not to expose the organic encapsulation layer 420 to the outside.

As described above, since the encapsulation layer 400 includes the first inorganic encapsulation layer 410, the organic encapsulation layer 420, and the second inorganic encapsulation layer 430, even if there is a crack in the encapsulation layer 400 in the above multi-layered structure, the crack may be stopped between the first inorganic encapsulation layer 410 and the organic encapsulation layer 420 or between the organic encapsulation layer 420 and the second inorganic encapsulation layer 430. As such, a path through which external moisture or oxygen may infiltrate into the display area DA may be prevented from occurring, or the chance thereof may be reduced.

A polarization plate 520 may be on the encapsulation layer 400 via an optically clear adhesive (OCA) 510. The polarization plate 520 may reduce reflection of external light. For example, when external light that passes through the polarization plate 520 is reflected by an upper surface of the opposite electrode 330 and then passes through the polarization plate 520 again, the external light passes through the polarization plate 520 twice and its phase may thus be changed. Therefore, a phase of reflected light is different from the phase of the external light entering the polarization plate 520 and thus destructive interference occurs. Accordingly, reflection of external light may be reduced and visibility may be improved. The OCA 510 and the polarization plate 520 may cover an opening in the planarization layer 140, as shown in FIG. 2. The display apparatus according to one or more embodiments may not essentially include the polarization plate 520, and if necessary, the polarization plate 520 may be omitted or replaced by other elements. For example, the polarization plate 520 may be omitted, and a black matrix and a color filter may be used to reduce reflection of external light.

In addition, the buffer layer 110, the gate insulating layer 120, and an interlayer insulating layer 130 may be collectively referred to as an inorganic insulating layer. The inorganic insulating layer may include a first opening OP1 corresponding to the bent area BA, as shown in FIG. 2. That is, the buffer layer 110, the gate insulating layer 120, and the interlayer insulating layer 130 may respectively include openings 110*a*, 120*a*, and 130*a* corresponding to the bent area BA. That the first opening OP1 corresponds to the bent area BA may denote that the first opening OP1 overlaps with the bent area BA. Here, an area of the first opening OP1 may be greater than that of the bent area BA. To do this, in FIG. 2, a width OP1*w* of the first opening OP1 is greater than a width BAw of the bent area BA. Here, the area of the first opening OP1 may be defined as the smallest area among areas of the respective openings 110*a*, 120*a*, and 130*a* in the buffer layer 110, the gate insulating layer 120, and the interlayer insulating layer 130. Accordingly, in FIG. 2, the area of the first opening OP1 is defined by an area of the opening 110*a* in the buffer layer 110.

The display apparatus according to the embodiment includes an organic material layer 160 that fills at least a part of the first opening OP1 in the inorganic insulating layer. In FIG. 2, the organic material layer 160 is shown to entirely fill the first opening OP1. In addition, the display apparatus according to the embodiment includes a first conductive layer 215*c* over the organic material layer 160, wherein the first conductive layer 215*c* extends from the first area 1A to the second area 2A through the bent area BA. The first conductive layer 215*c* may be positioned over the inorganic insulating layer such as the interlayer insulating layer 130 where the organic material layer 160 is not present. The first conductive layer 215*c* may be formed simultaneously with the source electrode 215*a* or the drain electrode 215*b* by using the same material as that of the source electrode 215*a* or the drain electrode 215*b*.

As described above, the display apparatus is not in a bent state in FIG. 2. However, the display apparatus according to the embodiment is actually in a state in which the substrate 100 is bent at the bent area BA as shown in FIG. 1. To do this, the display apparatus is manufactured so that the substrate 100 is in a nearly flat state during manufacturing processes as shown in FIG. 2, and after that, the substrate 100 is bent at the bent area BA so that the display apparatus may have the shape as illustrated in FIG. 1. Here, during bending of the substrate 100 at the bent area BA, tensile stress may be applied to the first conductive layer 215*c*. However, in the display apparatus according to the embodiment, generation of defects in the first conductive layer 215*c* during the bending process may be prevented or reduced.

If the inorganic insulating layers such as the buffer layer 110, the gate insulating layer 120, and/or the interlayer insulating layer 130 do not have an opening corresponding to the bent area BA, but continuously extend from the first area 1A to the second area 2A, and if the first conductive layer 215*c* is on the inorganic insulating layers, large tensile stress is applied to the first conductive layer 215*c* during bending of the substrate 100. In particular, since the inorganic insulating layer has a greater hardness than that of the organic material layer 160, cracks are likely to form in the inorganic insulating layer in the bent area BA, and when a crack occurs in the inorganic insulating layer, the crack may also occur in the first conductive layer 215*c* on the inorganic insulating layer and thus the probability of generating defects such as disconnection in the first conductive layer 215*c* increases greatly.

However, in the display apparatus according to the embodiment, the inorganic insulating layer includes the first opening OP1 corresponding to the bent area BA as described above. Further, a portion of the first conductive layer 215*c* corresponding to the bent area BA is located on the organic material layer 160 that at least partially fills the first opening OP1. Since the inorganic insulating layer includes the first opening OP1 corresponding to the bent area BA, the possibility of cracks occurring in the inorganic insulating layer is greatly decreased, and the organic material layer 160 is less likely to have cracks due to characteristics of the organic material. Therefore, the occurrence of cracks in the portion of the first conductive layer 215*c* on the organic material layer 160 may be prevented or reduced, wherein the portion of the first conductive layer 215*c* corresponds to the bent area BA. Since the organic material layer 160 has a lower hardness than that of an inorganic material layer, the organic material layer 160 may absorb the tensile stress generated due to the bending of the substrate 100 so as to reduce concentration of tensile stress in the first conductive layer 215*c*.

Moreover, the organic material layer 160 may have an irregular surface in at least a part of an upper surface thereof. As such, the first conductive layer 215*c* on the organic material layer 160 may also have an irregular shape corresponding to the irregular surface of the organic material layer 160. In this case, a surface area of the first conductive layer 215*c* increases, and accordingly, even when stress is generated in the first conductive layer 215*c* due to the bending of the substrate 100, the stress may be greatly reduced.

Although in FIG. 2 the inorganic insulating layer includes the first opening OP1, the inorganic insulating layer is not limited thereto. For example, the inorganic insulating layer may include a first groove, instead of the first opening OP1. That is, the buffer layer 110 may not include the opening 110*a* unlike the example illustrated with reference to FIG. 2, but may extend from the first area 1A to the second area 2A via the bent area BA, and only the gate insulating layer 120 and the interlayer insulating layer 130 may respectively have openings 120*a* and 130*a*. In this case, the buffer layer 110, the gate insulating layer 120, and the interlayer insulating layer 130 including the inorganic material may be collectively referred to as the inorganic insulating layer, and the inorganic insulating layer may be understood to have a first groove corresponding to the bent area BA. In addition, the organic material layer 160 may at least partially fill the first groove.

In the above case, since the inorganic insulating layer includes the first groove corresponding to the bent area BA, a thickness of the inorganic insulating layer is reduced in the bent area BA, and accordingly, the substrate 100 may be more easily bent. In addition, since the organic material layer 160 is in the bent area BA and the first conductive layer 215*c* is located on the organic material layer 160, damage to the first conductive layer 215*c* due to the bending process may be effectively prevented. An example in which the inorganic insulating layer includes the first opening OP1 is described in the above embodiments and other embodiments that will be described later, or modified examples thereof for convenience of description, but the inorganic insulating layer may include the first groove as described above.

The display apparatus according to the embodiment may include second conductive layers 213*a* and 213*b*, in addition to the first conductive layer 215c. The second conductive layers 213a and 213b are located in the first area 1A or the second area 2A to be at a different layer level from that of the first conductive layer 215c, and may be electrically connected to the first conductive layer 215c. In FIG. 2, the second conductive layers 213a and 213b are at the same layer as the gate electrode 213 of the TFT 210, that is, on the gate insulating layer 120, and are thus formed from the same material as that of the gate electrode 213. In addition, the first conductive layer 215c contacts the second conductive layers 213a and 213b via contact holes in the interlayer insulating layer 130. In addition, the second conductive layer 213a is in the first area 1A, and the second conductive layer 213b is in the second area 2A.

The second conductive layer 213a in the first area 1A may be electrically connected to the TFT 210 in the display area DA, and accordingly, the first conductive layer 215c may be electrically connected to the TFT 210 in the display area DA via the second conductive layer 213a. The second conductive layer 213b in the second area 2A may also be electrically connected to the TFT 210 of the display area DA via the first conductive layer 215c. As such, the second conductive layers 213a and 213b that are outside the display area DA may be electrically connected to the elements in the display area DA, or may extend toward the display area DA so that at least some parts of the second conductive layers 213a and 213b may be located in the display area DA.

As described above, although FIG. 2 shows a state in which the display apparatus is not bent for convenience of description, the display apparatus according to the embodiment is actually in a state in which the substrate 100 is bent at the bent area BA, as shown in FIG. 1. To do this, the display apparatus is manufactured so that the substrate 100 is flat, as shown in FIG. 2, during the manufacturing processes. Subsequently, the substrate 100 is bent at the bent area BA so that the display apparatus may have the shape as shown in FIG. 1. Here, while the substrate 100 is bent at the bent area BA, tensile stress may be applied to the elements in the bent area BA.

Therefore, the first conductive layer 215c crossing over the bent area BA includes a material having high elongation rate, so that defects such as cracks in the first conductive layer 215c or disconnections of the first conductive layer 215c may be prevented. In addition, the second conductive layers 213a and 213b include a material having an elongation rate lower than that of the first conductive layer 215c, and electrical/physical characteristics different from those of the first conductive layer 215c. Thus, an efficiency of transferring electric signals in the display apparatus may be improved or a defect rate during the manufacturing processes of the display apparatus may be reduced.

For example, the second conductive layers 213a and 213b may include molybdenum, and the first conductive layer 215c may include aluminum. The first conductive layer 215c and the second conductive layers 213a and 213b may have multi-layered structures, if desired. For example, the first conductive layer 215c may have a multi-layered structure such as a titanium layer/aluminum layer/titanium layer configuration, and the second conductive layers 213a and 213b may each have a multi-layered structure such as a molybdenum layer/titanium layer configuration. However, one or more embodiments are not limited thereto. That is, the first conductive layer 215c may extend to the display area DA to be electrically connected directly to the source electrode 215a, the drain electrode 215b, or the gate electrode 213 of the TFT 210.

In addition, as shown in FIG. 2, the organic material layer 160 may cover an internal surface of the first opening OP1 of the inorganic insulating layer. As described above, since the first conductive layer 215c may include the same material as, and may be formed simultaneously with, the source electrode 215a and the drain electrode 215b, a conductive layer may be formed on the interlayer insulating layer 130 throughout an entire surface of the substrate 100 and may be patterned to form the source electrode 215a, the drain electrode 215b, and the first conductive layer 215c. If the organic material layer 160 does not cover the inner side surface of the opening 110a in the buffer layer 110, the opening 120a in the gate insulating layer 120, or the opening 130a in the interlayer insulating layer 130, the conductive material of the conductive layer may not be removed from, but may remain on, the inner side surface of the opening 110a in the buffer layer 110, the inner side surface of the opening 120a in the gate insulating layer 120, or the inner side surface of the opening 130a in the interlayer insulating layer 130 during patterning of the conductive layer. In this case, the remaining conductive material may cause shorts between different conductive layers. Therefore, when the organic material layer 160 is formed, the organic material layer 160 may cover the inner side surface of the first opening OP1 in the inorganic insulating layer. For example, the organic material layer 160 may also cover an upper surface of the inorganic insulating layer around the first opening OP1.

In FIG. 2, the organic material layer 160 is shown to have a constant thickness, but the organic material layer 160 may also have a thickness that varies depending on locations therein. For example, an upper surface of the organic material layer 160 may have a curve having a slow inclination around the internal surface of the opening 110a in the buffer layer 110, the internal surface of the opening 120a in the gate insulating layer 120, and the internal surface of the opening 130a in the interlayer insulating layer 130. Accordingly, it is possible to prevent conductive material from remaining on the organic material layer 160 around an edge of the openings 110a, 120a, and 130a, when forming the source electrode 215a, the drain electrode 215b, and the first conductive layer 215c by patterning a conductive layer on the organic material layer 160. If the organic material layer 160 has a constant thin thickness such that the organic material layer 160 is formed to conform to the structure thereunder, conductive material residues may remain on the organic material layer 160 around the edge of the openings 110a, 120a, and 130a and these conductive material residues may arouse problems such as electrical shorts.

In addition, a bending protection layer (BPL) 600 may be located outside the display area DA. That is, the BPL 600 may be located above the first conductive layer 215c, corresponding at least to the bent area BA.

When a stack structure is bent, there is a stress neutral plane in the stack structure. If there is no BPL 600, when the substrate 100 is bent, excessive tensile stress may be applied to the first conductive layer 215c in the bent area BA, because the location of the first conductive layer 215c may not correspond to a stress neutral plane. However, by forming the BPL 600 and adjusting a thickness and a modulus of the BPL 600, a location of the stress neutral plane in the structure including the substrate 100, the first conductive layer 215c, and the BPL 600 may be adjusted. Therefore, the stress neutral plane may be adjusted to be around or above the first conductive layer 215c via the BPL 600, and thus, the tensile stress applied to the first conductive layer 215c may be reduced or compressive stress may be applied to the first conductive layer 215c. The BPL 600 may include acryl. When compressive stress is applied to the first conductive layer 215c, the possibility of damaging the first conductive layer 215c due to the compressive stress is much less than that of a case where tensile stress is applied to the first conductive layer 215c.

In FIG. 2, an end surface of the BPL 600 in a direction towards an edge of the substrate 100 (+x direction) does not coincide with an end surface of the substrate 100, but is located within the scope of the substrate 100. That is, the outer edge of BPL 600 lies within the outer edge of substrate 100. However, one or more embodiments are not limited thereto, that is, the end surface of the BPL 600 in the direction towards the edge of the substrate 100 (+x direction) may correspond to the end surface of the substrate 100 (one edge of BPL 600 may extend very close to, or lie flush with, the corresponding edge of substrate 100). In particular, as shown in FIG. 6 which is a schematic cross-sectional view taken along a line VI-VI of FIG. 3, the BPL 600 is present over the first opening OP1 in the inorganic insulating layer, and a side end surface of the BPL 600 (in the +y direction or −y direction) may coincide with a side end surface of the substrate 100. That is, edges of the substrate 100 which are perpendicular to the bending axis BAX (see FIG. 1) may coincide with corresponding edges of the BPL 600.

A plurality of display units is formed on a mother substrate and then the mother substrate is cut in order to simultaneously manufacture a plurality of display apparatuses. When the BPL 600 is formed on the mother substrate before the cutting process of the mother substrate, the BPL 600 may be at least partially cut together with the mother substrate when the mother substrate is cut. Accordingly, in the display apparatus manufactured after cutting the mother substrate, side end surfaces of the edges of the substrate 100 that are nearly perpendicular to the bending axis BAX (see FIG. 1) may coincide with the corresponding side end surfaces of the BPL 600. The cutting may be performed by irradiating a laser beam to the mother substrate. In addition, FIG. 3 shows that a line VI-VI is within the first opening OP1 and outside the bent area BA, and thus, an edge of the display apparatus in the bent area BA may have the same or similar cross-section as/to that of FIG. 6.

Although in FIG. 6 a planarization layer 140 is shown to be disposed between the BPL 600 and the first conductive layer 215c, the planarization layer 160 is not limited thereto. For example, the planarization layer 160 may not be deposited in the first opening OP1.

In addition, in FIG. 2, an upper surface of the BPL 600 in a direction towards the display area DA (−x direction) corresponds to an upper surface of the polarization plate 520 (in the +z direction), but is not limited thereto. For example, an end of the BPL 600 in the direction towards the display area DA (−x direction) may partially cover an upper surface at the edge of the polarization plate 520. Alternatively, the end of the BPL 600 in the direction towards the display area DA (−x direction) may not contact the polarization plate 520 and/or the OCA 510. In the latter case, during or after forming the BPL 600, gas generated from the BPL 600 is less able to enter the display area DA (−x direction) and degradation of the display device 300 may thus be prevented.

As shown in FIG. 2, if the upper surface of the BPL 600 in a direction towards the display area DA (−x direction) coincides with the upper surface of the polarization plate 520 in the +z direction, if the end of the BPL 600 in the display area DA direction (−x direction) partially covers the upper surface at the end of the polarization plate 520, or if the end of the BPL 600 in the display area DA direction (−x direction) contacts the OCA 510, a thickness of the BPL 600 corresponding to the display area DA (−x direction) may be greater than that of other portions of the BPL 600. Since a liquid phase material or a paste-type material may be applied and hardened to form the BPL 600, a volume of the BPL 600 may be reduced during the hardening process. Here, if the portion of the BPL 600 corresponding to the display area DA (−x direction) is in contact with the polarization plate 520 and/or the OCA 510, that portion of the BPL 600 is fixed at that location, and thus, a volume reduction occurs in the remaining portion of the BPL 600. Therefore, the thickness of the BPL 600 corresponding to the display area DA (−x direction) may be greater than that of other portions of the BPL 600.

In addition, in the display apparatus according to the embodiment, the inorganic insulating layer further includes a second opening OP2, in addition to the first opening OP1, as shown in FIG. 3. The second opening OP2 is located outside the display area DA, and extends along at least a part of the display area DA. As described above, since the inorganic insulating layer is understood to include the buffer layer 110, the gate insulating layer 120, and/or the interlayer insulating layer 130, the second opening OP2 may be defined by an opening in the buffer layer 110, as shown in FIG. 4.

During the manufacturing processes or in use of the display apparatus after being manufactured, external shock may be applied to the display apparatus. When external shock is applied, cracks may occur in the inorganic insulating layer such as in the buffer layer 110, the gate insulating layer 120, and/or the interlayer insulating layer 130, and these cracks may propagate in the inorganic insulating layer. Therefore, if a crack extends to the display area DA, it may spread to the TFT 210 or various lines and may cause defects such as malfunction of the display apparatus.

However, in the display apparatus according to the embodiment, the inorganic insulating layer includes the second opening OP2 that is located outside the display area DA and extends along at least a part of the display area DA. Therefore, even if cracks may occur in the outer part of buffer layer 110 due to external shock, extension of the cracks towards the display area DA may be effectively prevented by the second opening OP2.

In particular, as shown in FIG. 3, the second opening OP2 in the inorganic insulating layer may be connected to the first opening OP1, and moreover, the second opening OP2 may extend around (i.e., surround) the circumference of the display area DA to enclose the display area DA together with the first opening OP1. Here, the second opening OP2 is connected to, and extends from, the first opening OP1. As shown in FIG. 3, the collective shape of the second opening OP2 and the first opening OP1 may surround the circumference of the display area DA, and thus, cracks generated at an outer portion of the display apparatus due to external shock may be kept from extending towards the display area DA.

Although FIG. 4 illustrates that the inorganic insulating layer includes the second opening OP2, one or more embodiments are not limited thereto. For example, the inorganic insulating layer may include a second groove, instead of the second opening OP2. That is, the buffer layer 110, for example, may not be completely removed, but an upper portion of the buffer layer 110 may be only partially removed, unlike the shape shown in FIG. 4. In this case, the inorganic insulating layer may be understood to have a second groove. In particular, in a case where the buffer layer 110 has a multi-layered structure including the barrier layer as described above, upper layers from among the plurality of layers in the buffer layer 110 may be removed and lower layers remain, or an upper layer and a part of the lower layers are removed and a lower portion of the lower layers may not be removed. In this case, the inorganic insulating layer may be understood to have the second groove. This may be applied to embodiments that will be described later or modified examples thereof. Hereinafter, a case in which the inorganic insulating layer includes the second opening will be described below.

As described above, since the organic material layer 160 covers the first opening OP1 in the inorganic insulating layer, the organic material layer 160 may also cover the second opening OP2 in the inorganic insulating layer. Also as described above, a conductive layer is formed on the interlayer insulating layer 130 above the entire surface of the substrate 100 and is patterned to form the source electrode 215a, the drain electrode 215b, and the first conductive layer 215c. If the organic material layer 160 does not cover the second opening OP2 in the inorganic insulating layer, the conductive material of the conductive layer may not be removed from, but may remain on, the inner side surface of the opening 110a in the buffer layer 110, the inner side surface of the opening 120a in the gate insulating layer 120, or the inner side surface of the opening 130a in the interlayer insulating layer 130 during patterning the conductive layer. In this case, this remaining conductive material may cause shorts between different conductive layers. Therefore, when the organic material layer 160 is formed, the organic material layer 160 may cover the inner side surface of the second opening OP2 in the inorganic insulating layer. For example, the organic material layer 160 may also cover an upper surface of the inorganic insulating layer around the second opening OP2.

In addition, FIG. 4 illustrates that the inorganic insulating layer may have a thickness that varies depending on location. That is, at a center portion of the first area 1A, the inorganic insulating layer includes the thickness of the buffer layer 110, the gate insulating layer 120, and the interlayer insulating layer 130, whereas the inorganic insulating layer only includes the thickness of the buffer layer 110 outside the second opening OP2. Thus, the thickness of the inorganic insulating layer at the center portion of the first area 1A is greater than that of the inorganic insulating layer at the outside the second opening OP2. This may be understood that the inorganic insulating layer has a multi-layered structure and the number of layers in the inorganic insulating layer at the center portion of the first area 1A is greater than that at the outside of the second opening OP2. In the example illustrated in FIG. 4, the inorganic insulating layer has a single-layered structure only including the buffer layer 110 immediately outside the second opening OP2.

A plurality of display units is formed on a mother substrate and then the mother substrate is cut in order to simultaneously manufacture a plurality of display apparatuses. When cutting the mother substrate, the inorganic insulating layer above the mother substrate is also cut, and cracks may occur in the inorganic insulating layer while the inorganic insulating layer is cut. Although the cracks may be small initially, they may become bigger due to external shock during the manufacturing processes of the display apparatus or during use of the display apparatus after being manufactured, and this may generate defects. Therefore, when cutting the mother substrate, it is desirable to prevent the occurrence of cracks or reduce cracks.

In the display apparatus according to the embodiment, the inorganic insulating layer may be thin, may have a single-layered structure, or may have fewer layers at the outside of the second opening OP2 as described above, and accordingly, cracks may not occur in the inorganic insulating layer or the size of cracks may be reduced when cutting the mother substrate. In particular, as the thickness of the inorganic insulating layer is reduced, the possibility of generating cracks during cutting of the inorganic insulating layer is decreased.

To obtain the same/similar effects, the inorganic insulating layer illustrated in FIG. 2 may also have a similar structure to that of the present embodiment. In more detail, the inorganic insulating layer may have a triple-layered structure in the first area 1A, and in the second area 2A, the inorganic insulating layer may only include the buffer layer 110 around the edge of the substrate 100 while the inorganic insulating layer around the first opening OP1 has the triple-layered structure. Here, in the second area 2A, the inorganic insulating layer has the triple-layered structure in at least a portion near a pad 215d (see FIG. 3), and may only have the buffer layer 110 around the edges of the substrate 100.

In order for the source electrode 215a or the drain electrode 215b to contact the semiconductor layer 211 during the processes of forming the TFT 210, contact holes may be formed in the gate insulating layer 120 and the interlayer insulating layer 130. As shown in FIG. 4, removing part of the gate insulating layer 120 and the interlayer insulating layer 130 to form the second opening OP2 or removing part of the gate insulating layer 120 and the interlayer insulating layer 130 outside the second opening OP2 may be simultaneously performed with the forming of the contact holes.

As shown in FIG. 2, removing part of the gate insulating layer 120 and the interlayer insulating layer 130 to form the first opening OP1 may be performed simultaneously with forming of the contact holes. Accordingly, in FIG. 2, the internal surface of the opening 120a in the gate insulating layer 120 and the internal surface of the opening 130a in the interlayer insulating layer 130 configure a continuous surface in the first opening OP1. The buffer layer 110 may be partially removed by using a dry etching method in order to form the opening 110a or the second opening OP2 before forming the gate insulating layer 120 and the interlayer insulating layer 130.

In addition, as shown in FIG. 3, the inorganic insulating layer of the display apparatus may include a third opening OP3, in addition to the first opening OP1 and the second opening OP2. In detail, the second area 2A may include a pad area PA, and the inorganic insulating layer may include the third opening OP3 located outside the pad area PA. As described above, the inorganic insulating layer may be understood to include the buffer layer 110, the gate insulating layer 120, and/or the interlayer insulating layer 130, and thus, the third opening OP3 may be defined by an opening in the buffer layer 110, as shown in FIG. 5.

During manufacturing processes of the display apparatus or while in use after being manufactured, various external shocks may be applied to the display apparatus. When external shock is applied, cracks may occur in the buffer layer 110, the gate insulating layer 120, and/or the interlayer insulating layer 130, and these cracks may propagate along the inorganic material layer. Therefore, if a crack extends to the pad area PA, and in particular to various pads 215d in the pad area PA, defects such as malfunction of the display apparatus may occur. In FIG. 3, the pads 215d are schematically shown, and the pads 215d may be electrically connected to the TFT 210 of the display area DA via lines that are not shown, e.g., the first conductive layer 215*c* (see FIG. 2).

However, according to the display apparatus of the embodiment, the inorganic insulating layer includes the third opening OP3 that is located outside the pad area PA and extends along at least a part of the edge of the substrate 100, that is, at least a part of the pad area PA. Therefore, even if cracks occur in the buffer layer 110 located at the outer portion of the display apparatus due to external shock, extension of the cracks towards the pad area PA may be prevented by the third opening OP3. In particular, as shown in FIG. 3, the third opening OP3 is connected to the first opening OP1 in the inorganic insulating layer, in order to protect the pad area PA.

Moreover, as shown in FIG. 3, a distance d1 between an end of the third opening OP3 in a direction towards the edge of the substrate 100 (+x direction) and the edge of the substrate 100 may be less than a distance d2 between an end of the pad 215*d* in the direction towards the edge of the substrate 100 (+x direction) and the edge of the substrate 100. Through the above configuration, the pad 215*d* may be sufficiently protected by the third opening OP3.

Although in FIG. 5 the inorganic insulating layer is shown to have the third opening OP3, the inorganic insulating layer is not limited thereto. For example, the inorganic insulating layer may include a third groove, rather than the third opening OP3. For example, part of the buffer layer 110 may not be completely removed unlike the shape shown in FIG. 5, but an upper part of the buffer layer 110 may be partially removed. In this case, the inorganic insulating layer may be understood to have the third groove. This will be applied to embodiments that will be described later or modified examples thereof. Hereinafter, a case in which the inorganic insulating layer has the third opening OP3 will be described for convenience of description.

As described above, since the organic material layer 160 covers the first opening OP1 and the second opening OP2 of the inorganic insulating layer, the organic material layer 160 may also cover the third opening OP3 in the inorganic insulating layer. As described above, a conductive layer is formed on the interlayer insulating layer 130 above the entire surface of the substrate 100 and is patterned to form the source electrode 215*a*, the drain electrode 215*b*, and the first conductive layer 215*c*. If the organic material layer 160 does not cover the third opening OP3 in the inorganic insulating layer, the conductive material of the conductive layer may not be removed from, but may remain on, the inner side surface of the opening 110*a* in the buffer layer 110, the inner side surface of the opening 120*a* in the gate insulating layer 120, or the inner side surface of the opening 130*a* in the interlayer insulating layer 130 during patterning the conductive layer. In this case, the remaining conductive material may cause shorts between different conductive layers. Therefore, when the organic material layer 160 is formed, the organic material layer 160 may cover an inner side surface of the third opening OP3 in the inorganic insulating layer. The organic material layer 160 may also cover an upper surface of the inorganic insulating layer around the third opening OP3.

In addition, in FIG. 5, the inorganic insulating layer is shown to have a varying thickness. That is, the inorganic insulating layer includes the buffer layer 110, the gate insulating layer 120, and the interlayer insulating layer 130 at a center portion of the pad area PA, but the inorganic insulating layer only includes the buffer layer 110 near the third opening OP3 so that the thickness of the inorganic insulating layer is greater at the center portion of the pad area PA than that near the third opening OP3. In other words, the inorganic insulating layer includes a multi-layered structure, where the number of layers in the inorganic insulating layer at the center portion of the pad area PA is greater than that in the inorganic insulating layer at or near the third opening OP3. In the example illustrated in FIG. 5, the inorganic insulating layer has a single-layered structure only including the buffer layer 110 at and near the third opening OP3.

The display apparatus according to the embodiment includes the above structure, and thus, cracks may not occur in the inorganic insulating layer when cutting a mother substrate, or the size of cracks may be reduced. As the thickness of the inorganic insulating layer decreases, the possibility of generating cracks may be reduced while cutting the inorganic insulating layer.

In order for the source electrode 215*a* or the drain electrode 215*b* to contact the semiconductor layer 211 when the TFT 210 is formed, contact holes are formed in the gate insulating layer 120 and the interlayer insulating layer 130. As shown in FIG. 5, removing part of the gate insulating layer 120 and the interlayer insulating layer 130 to form the third opening OP3 or removing part of the gate insulating layer 120 and the interlayer insulating layer 130 outside the third opening OP3 may be performed simultaneously with forming of the contact holes. In addition, removing part of the buffer layer 110 to form the third opening OP3 may be performed by using a dry etching method, before forming the gate insulating layer 120 and the interlayer insulating layer 130.

Figure 7:
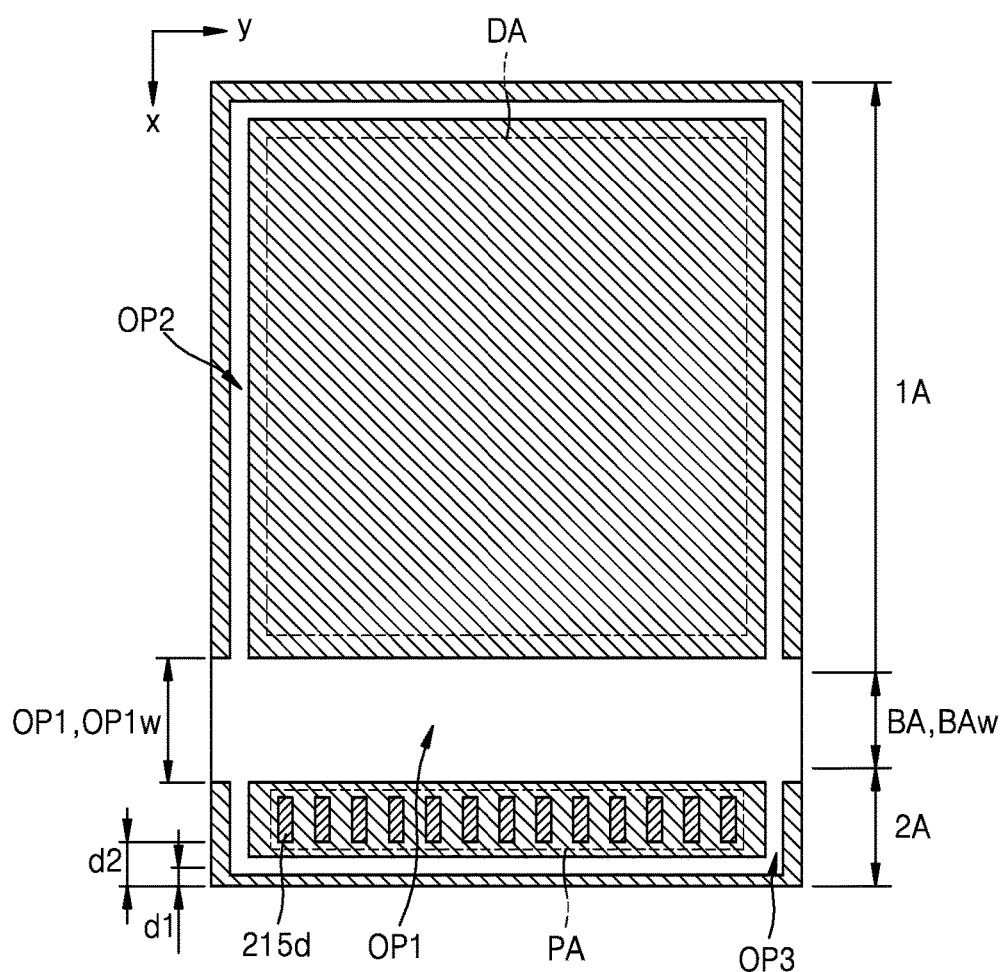
FIG. 7 is a schematic plan view of a part of a display apparatus according to an embodiment.

FIG. 7 is a schematic plan view of a part of a display apparatus according to an embodiment. As shown in FIG. 7, the third opening OP3 is connected to the first opening OP1 in the inorganic insulating layer, and moreover, the third opening OP3 may extend around (i.e., surround) the pad area PA. That is, the third opening OP3 and the first opening OP1 are connected to each other and collectively surround the pad area PA. As shown in FIG. 7, the collective shape of the third opening OP3 and the first opening OP1 may surround the circumference of the pad area PA, and thus, cracks generated at an outer portion of the display apparatus due to external shock may not proceed towards the display area DA.

Figure 8:
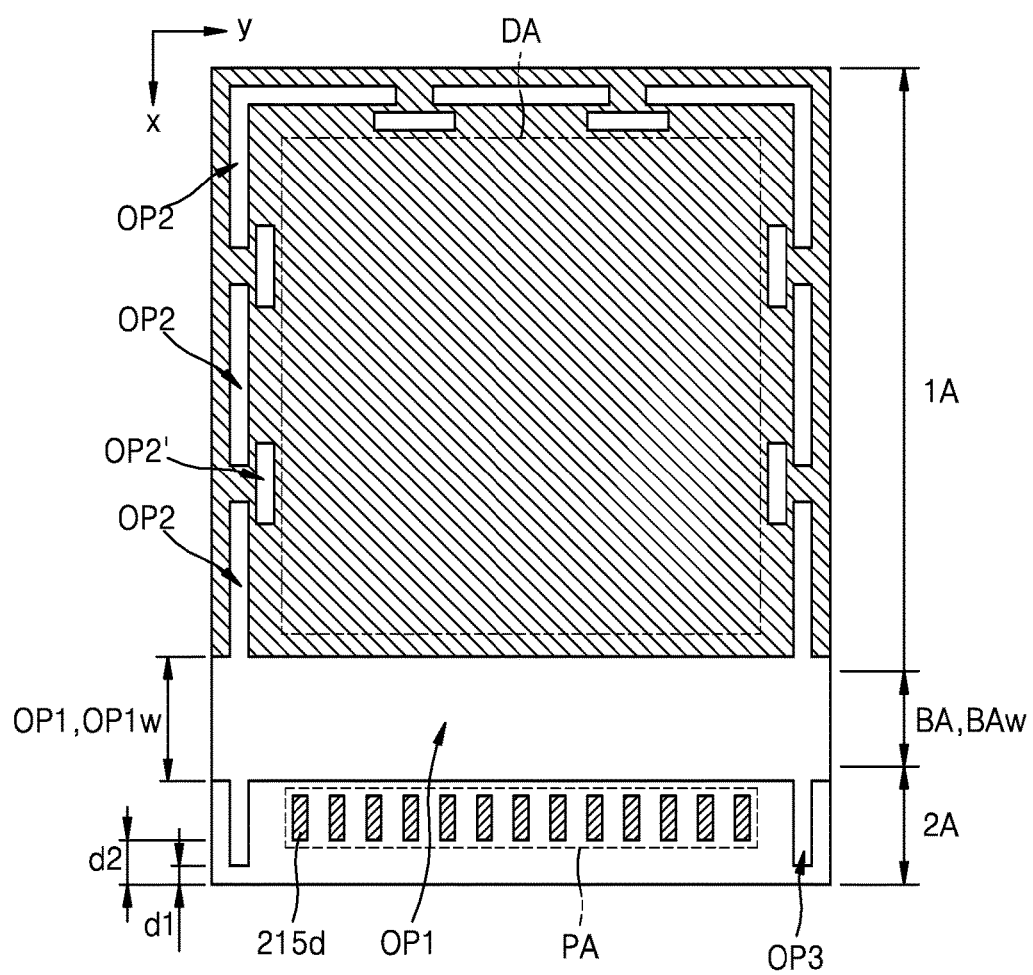
FIG. 8 is a schematic plan view of a part of a display apparatus according to an embodiment.

Although in FIG. 3 the second opening OP2 continuously surrounds the outside of the display area DA along the display area DA, one or more embodiments are not limited thereto. For example, as shown in FIG. 8 which is a schematic plan view of a part of a display apparatus according to the embodiment, the second opening OP2 may be discontinuous in some sections. In this case, with respect to the discontinuous part of the second opening OP2, the display apparatus may further include an additional opening OP2' corresponding to the discontinuous part and separated from the second opening OP2, as shown in FIG. 8. As such, even when cracks propagate towards the display area DA through the gaps in the second opening OP2, further extension of the cracks towards the display area DA may be effectively prevented by the additional openings OP2'.

Figure 9:
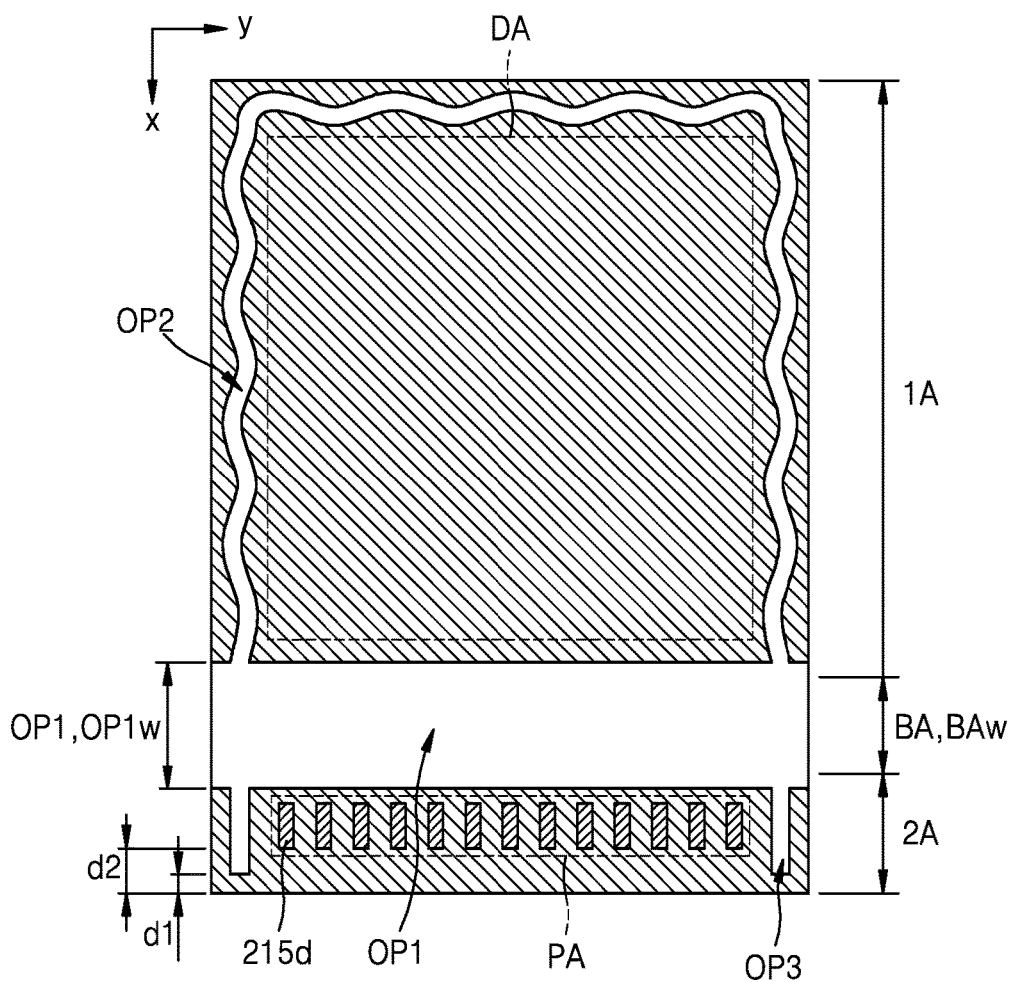
FIG. 9 is a schematic plan view of a part of a display apparatus according to an embodiment.

In addition, as shown in FIG. 9 that is a schematic plan view of a part of a display apparatus according to an embodiment, the second opening OP2 may extend in a zig-zag or nonlinear manner. In particular, the second opening OP2 may extend in zig-zags without forming sharp portions, in plan view. If the inorganic insulating layer has sharp portions, cracks are likely to occur in the sharp portions. Unlike the example of FIG. 9, the third opening OP3 may also have a zig-zag shape.

In addition, as described above, the display apparatus includes the encapsulation layer 400 (see FIG. 2), and the encapsulation layer 400 includes the first inorganic encapsulation layer 410 at a lowermost portion thereof. The first inorganic encapsulation layer 410 includes silicon oxide, silicon nitride, or silicon oxynitride, and thus, has a low bonding force with respect to the organic material layer 160. Therefore, the encapsulation layer 400 may be configured not to contact the organic material layer 160. That is, the encapsulation layer 400 may be configured to cover the display area DA and not to extend to the first opening OP1, the second opening OP2, and/or the third opening OP3 of the inorganic insulating layer, so that the encapsulation layer 400 may not contact the organic material layer 160 that fills the first opening OP1, the second opening OP2, and/or the third opening OP3.

Figure 10:
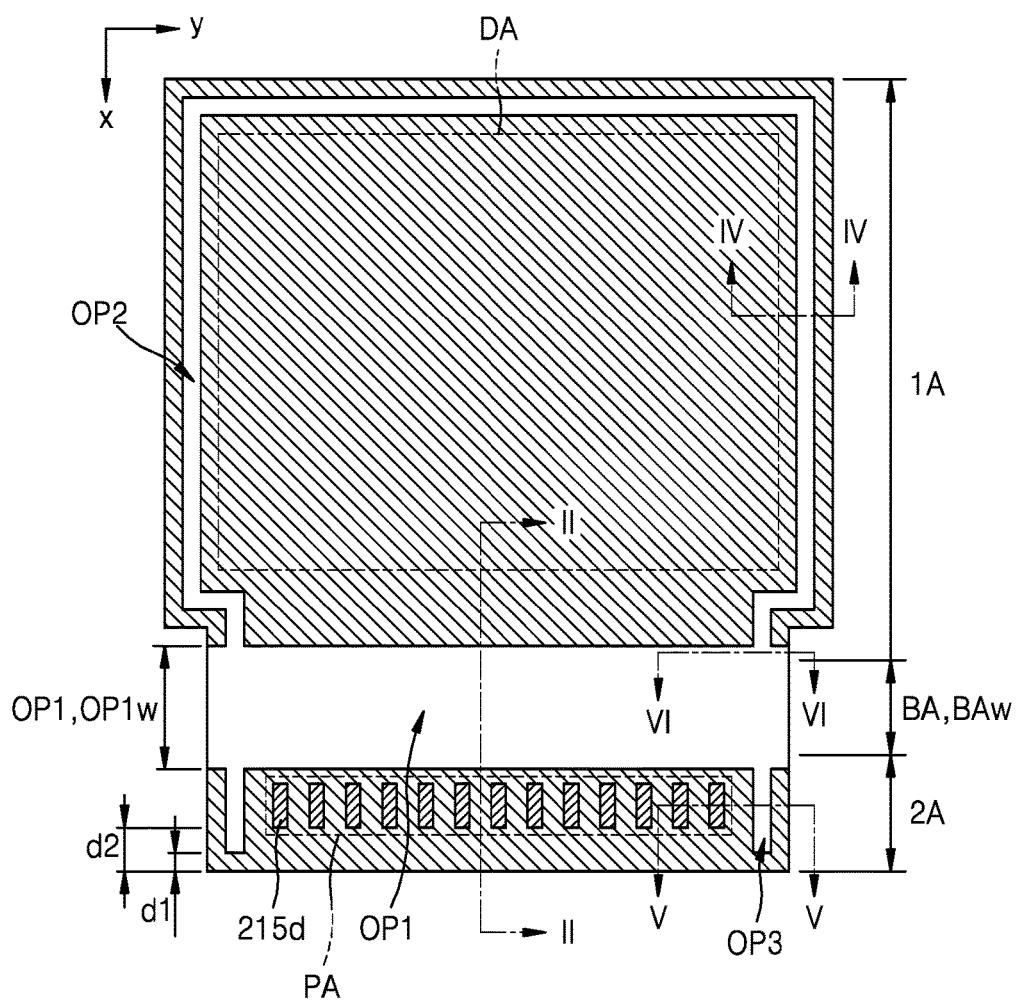
FIG. 10 is a schematic plan view of a part of a display apparatus according to an embodiment.

A display apparatus having a rectangular planar shape before being bent is described above, but one or more embodiments are not limited thereto. That is, although in FIGS. 3 to 7 and 9 the substrate 100 has a constant width in the y-axis direction throughout the first area 1A, the bent area BA, and the second area 2A, the substrate 100 is not limited thereto. For example, as shown in FIG. 10 which is a schematic plan view of a part of a display apparatus according to an embodiment, the substrate 100 may have a width varying in the y-axis direction within the first area 1A. In this case, a width of the substrate 100 at a narrower portion within the first area 1A may be equal to that of the substrate 100 in the bent area BA or the second area 2A, as shown in FIG. 10.

A plurality of display units is formed on a mother substrate and then the mother substrate is cut in order to simultaneously manufacture a plurality of display apparatuses. In this case, a primary cutting is performed so that each of the display apparatuses has a rectangular shape, and after that, a secondary cutting is performed throughout a part of the first area 1A, the bent area BA, and the second area 2A to manufacture the display apparatus as shown in FIG. 10. In particular, through the secondary cutting, the side end surface of the BPL 600 (in the +y direction or −y direction) may correspond to the side end surface of the substrate 100 as shown in FIG. 6. Finally, the substrate 100 is bent at the bent area BA.

Figure 11:
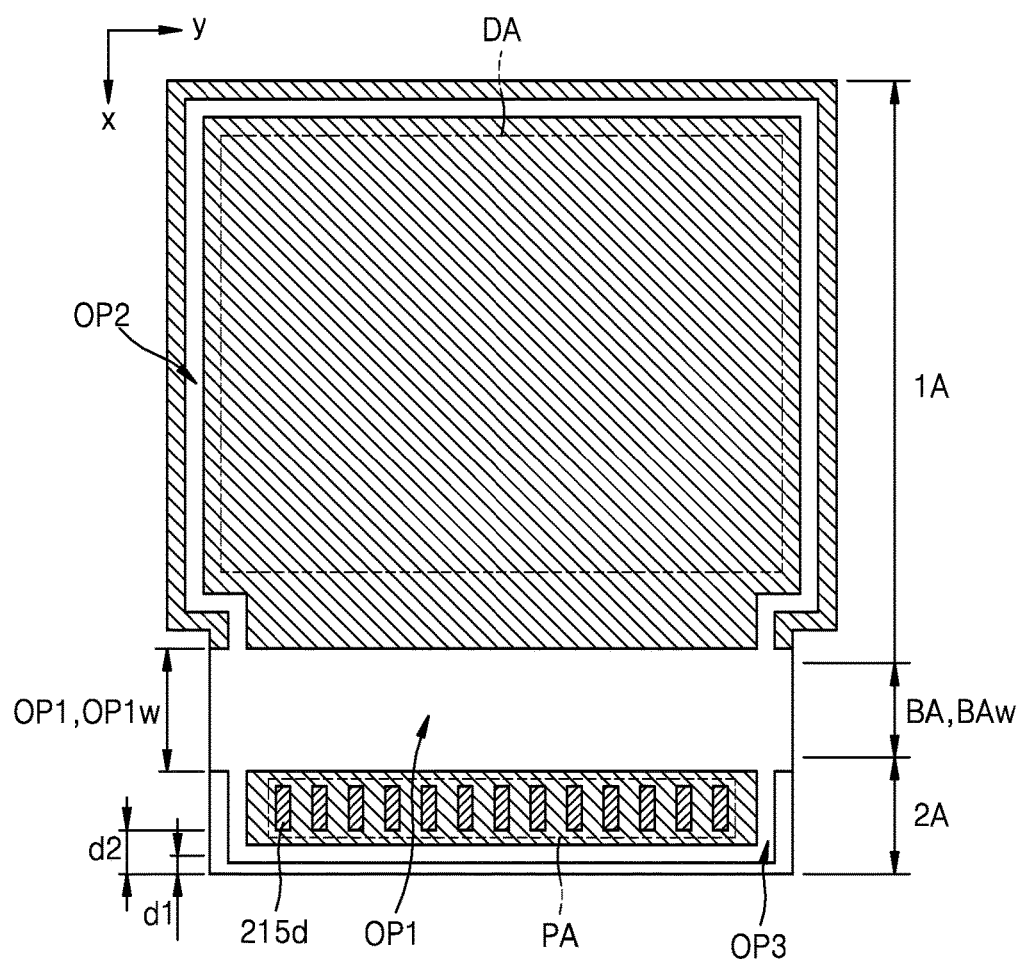
FIG. 11 is a schematic plan view of a part of a display apparatus according to an embodiment.
Figure 12:
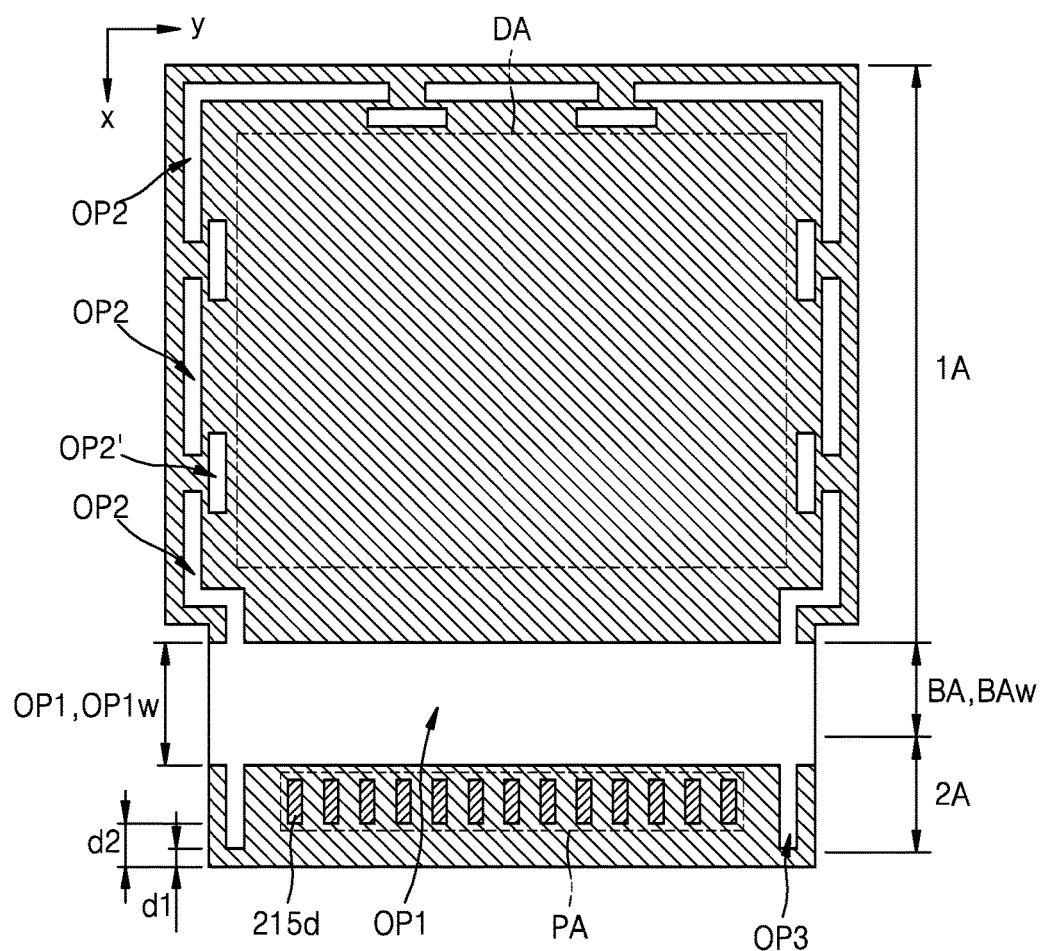
FIG. 12 is a schematic plan view of a part of a display apparatus according to an embodiment.
Figure 13:
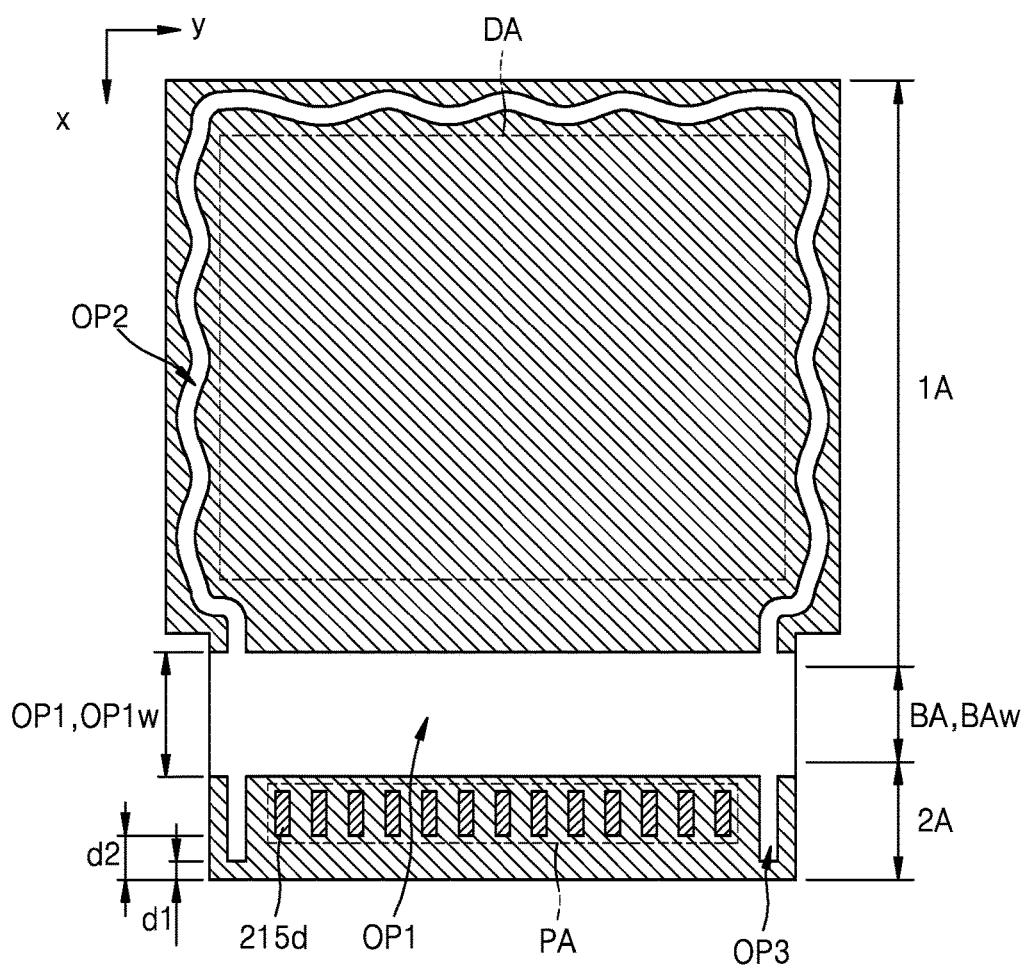
FIG. 13 is a schematic plan view of a part of a display apparatus according to an embodiment.

In a case where the inorganic insulating layer includes the third opening OP3, in addition to the first opening OP1 and the second opening OP2, the substrate 100 may have a width that varies within the first area 1A in the y-axis direction, as shown in FIG. 11. Here, within the first area 1A, a narrower width of the substrate 100 may be equal to a width of the substrate 100 within the bent area BA or the second area 2A, as shown in FIG. 11. In addition, in a case where the inorganic insulating layer includes a discontinuous second opening OP2 and an additional opening OP2' corresponding to the discontinuous portions, or in a case where the second opening OP2 in the inorganic insulating layer has a zig-zag shape, the substrate 100 may have a width that varies within the first area 1A in the y-axis direction, as shown in FIGS. 12 and 13.

According to one or more embodiments, generation of defects in the display apparatus during manufacturing processes or while in use after being manufactured, may be reduced. However, a scope of the present disclosure is not limited to the above effects.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims. Various features of the above described and other embodiments can be mixed and matched in any manner, to produce further embodiments consistent with the invention.

What is claimed is:

1. A display apparatus comprising:
   a substrate comprising a first area including a display area, a second area spaced apart from the first area, and a bent area between the first area and the second area and connecting the first area and the second area to each other, wherein the substrate is bent about a bending axis;
   an inorganic insulating layer over the substrate, wherein the inorganic insulating layer comprises a first opening or a first groove formed to overlap the bent area when viewed in a direction perpendicular to the substrate in the bent area and extending along a first side of the display area, and a second opening or a second groove located in the first area, a part of the second opening or the second groove extending along a second side, which is different from the first side, of the display area; and
   an organic material layer, wherein the organic material layer at least partially fills the first opening or the first groove, and at least partially fills the second opening or the second groove.

2. The display apparatus of claim 1, wherein the second opening or the second groove is connected to the first opening or the first groove.

3. The display apparatus of claim 2, wherein the second opening or the second groove, together with the first opening or the first groove, collectively surround the display area.

4. The display apparatus of claim 1, wherein a thickness of the inorganic insulating layer at a central portion of the first area is greater than a thickness of the inorganic insulating layer proximate to the second opening or the second groove.

5. The display apparatus of claim 1, wherein the inorganic insulating layer comprises multiple layers, and a number of layers in the inorganic insulating layer at a central portion of the first area is greater than a number of the layers in the inorganic insulating layer proximate to the second opening or the second groove.

6. The display apparatus of claim 1, wherein the inorganic insulating layer comprises multiple layers at a central portion of the first area, and the inorganic insulating layer has only a single layer proximate to the second opening or the second groove.

7. The display apparatus of claim 1, wherein the second area comprises a pad area, and the inorganic insulating layer comprises a third opening or a third groove located outside the pad area.

8. The display apparatus of claim 7, wherein the third opening or the third groove is connected to the first opening or the first groove.

9. The display apparatus of claim 8, wherein the third opening or the third groove, together with the first opening or the first groove, collectively surround the pad area.

10. The display apparatus of claim 7, further comprising a pad in the pad area,
wherein a distance between an end of the third opening or the third groove and the end of the substrate is less than a distance between an end of the pad and the end of the substrate.

11. The display apparatus of claim 7, wherein a thickness of the inorganic insulating layer at a central portion of the pad area is greater than a thickness of the inorganic insulating layer proximate to the third opening or the third groove.

12. The display apparatus of claim 7, wherein the inorganic insulating layer comprises multiple layers, and a number of layers in the inorganic insulating layer at a central portion of the pad area is greater than a number of layers in the inorganic insulating layer proximate to the third opening or the third groove.

13. The display apparatus of claim 7, wherein the inorganic insulating layer comprises multiple layers at a central portion of the pad area, and the inorganic insulating layer has only a single layer proximate to the third opening or the third groove.

14. The display apparatus of claim 1, wherein the organic material layer covers an upper surface of the inorganic insulating layer proximate to the first opening or the first groove and an upper surface of the inorganic insulating layer proximate to the second opening or the second groove.

15. A display apparatus comprising:
a substrate comprising a first area including a display area, a second area spaced apart from the first area, and a bent area between the first area and the second area and connecting the first area and the second area to each other, wherein the substrate is bent about a bending axis;
an inorganic insulating layer over the substrate and directly contacting an upper surface of the substrate, wherein the inorganic insulating layer comprises a first opening or a first groove formed to overlap the bent area when viewed in a direction perpendicular to the substrate in the bent area and extending along a first direction, and a second opening or a second groove located outside the display area, a part of the second opening or the second groove extending along a second direction different from the first direction along at least a part of the display area; and
an organic material layer, wherein the organic material layer at least partially fills the first opening or the first groove, and at least partially fills the second opening or the second groove.

16. The display apparatus of claim 15, wherein the second opening or the second groove is connected to the first opening or the first groove.

17. The display apparatus of claim 15, wherein the second opening or the second groove, together with the first opening or the first groove, collectively surround the display area.

18. The display apparatus of claim 15, wherein the inorganic insulating layer comprises multiple layers, and a number of layers in the inorganic insulating layer at a central portion of the first area is greater than a number of the layers in the inorganic insulating layer proximate to the second opening or the second groove.

19. The display apparatus of claim 15, wherein the second area comprises a pad area, and the inorganic insulating layer comprises a third opening or a third groove located outside the pad area.

20. The display apparatus of claim 19, wherein the third opening or the third groove is connected to the first opening or the first groove.

* * * * *